US012564019B2

(12) United States Patent
Nguyenphuoc

(10) Patent No.: US 12,564,019 B2
(45) Date of Patent: Feb. 24, 2026

(54) WAFER FABRICATION PROCESS AND DEVICES WITH EXTENDED PERIPHERAL DIE AREA

(71) Applicant: pSemi Corporation, San Diego, CA (US)

(72) Inventor: Thomas Nguyenphuoc, Anaheim Hills, CA (US)

(73) Assignee: pSemi Corporation, San Diego, CA (US)

( * ) Notice: Subject to any disclaimer, the term of this patent is extended or adjusted under 35 U.S.C. 154(b) by 886 days.

(21) Appl. No.: 17/696,766

(22) Filed: Mar. 16, 2022

(65) Prior Publication Data

US 2023/0298952 A1      Sep. 21, 2023

(51) Int. Cl.
| | |
|---|---|
| *H01L 21/66* | (2006.01) |
| *H01L 21/78* | (2006.01) |
| *H01L 23/00* | (2006.01) |
| *H01L 23/58* | (2006.01) |

(52) U.S. Cl.
CPC .............. *H01L 22/34* (2013.01); *H01L 21/78* (2013.01); *H01L 22/14* (2013.01); *H01L 23/585* (2013.01); *H01L 24/02* (2013.01); *H01L 2224/02379* (2013.01)

(58) Field of Classification Search
CPC ..................... H01L 22/34; H01L 21/78; H01L 2224/02379; H01L 24/94; H01L 2224/0401; H10D 89/01
See application file for complete search history.

(56) References Cited

U.S. PATENT DOCUMENTS

| | | | |
|---|---|---|---|
| 10,559,525 B2 | 2/2020 | Yu | |
| 2008/0251788 A1* | 10/2008 | Maruyama | .............. H01L 24/94 |
| | | | 257/E21.523 |
| 2012/0329212 A1* | 12/2012 | Leal | ........................ H01L 21/56 |
| | | | 257/E21.502 |

(Continued)

FOREIGN PATENT DOCUMENTS

| | | |
|---|---|---|
| KR | 20050059618 A | 6/2005 |

OTHER PUBLICATIONS

Lapedus, M., et al., "Fan-Out Wars Begin," *Semiconductor Engineering: Deep Insight for the Tech Industry*. Published Feb. 5, 2018. 24 Pages.

(Continued)

*Primary Examiner* — Davienne N Monbleau
*Assistant Examiner* — Emily Farmer
(74) *Attorney, Agent, or Firm* — Steinfl + Bruno LLP

(57) ABSTRACT

Semiconductor (SC) chip devices and associated methods of making are presented. The SC chips are designed to include enlarged extension semiconductor areas next to functional integrated circuit (IC) dies on these SC chips. Some variations include designing semiconductor wafers prior to fabrication so that the resultant IC dies are surrounded by the extension semiconductor areas. Other variations include processing post manufactured semiconductor wafers to expand the size of the available extension areas by including truncated pieces of IC dies that are immediately adjacent to functional working primary IC dies. These variations provide additional room for redistribution layers to fan-out from the IC dies outwards onto the extension areas.

13 Claims, 8 Drawing Sheets

(56)　　　　　　References Cited

U.S. PATENT DOCUMENTS

2014/0264859 A1* 9/2014 Chen ........................ H01L 24/13
　　　　　　　　　　　　　　　257/738
2017/0062368 A1* 3/2017 Jung ........................ H01L 24/09
2018/0175006 A1　6/2018 Yan et al.
2022/0068736 A1* 3/2022 Lo ........................... H01L 24/81

OTHER PUBLICATIONS

Yu, D., et al., "Embedded Si Fan Out: A Low Cost Wafer Level Packaging Technology Without Molding and De-bonding Processes" *2017 IEEE 67th Electronic Components and Technology Conference (ECTC)*. 2017. pp. 28-34. 7 Pages. doi: 10.1109/ECTC. 2017.166.
International Search Report and Written Opinion for International Application No. PCT/US2023/064073 filled on Mar. 9, 2023 on behalf of PSEMI Corporation Mail Date: Jun. 29, 2023. 11 pages.

* cited by examiner

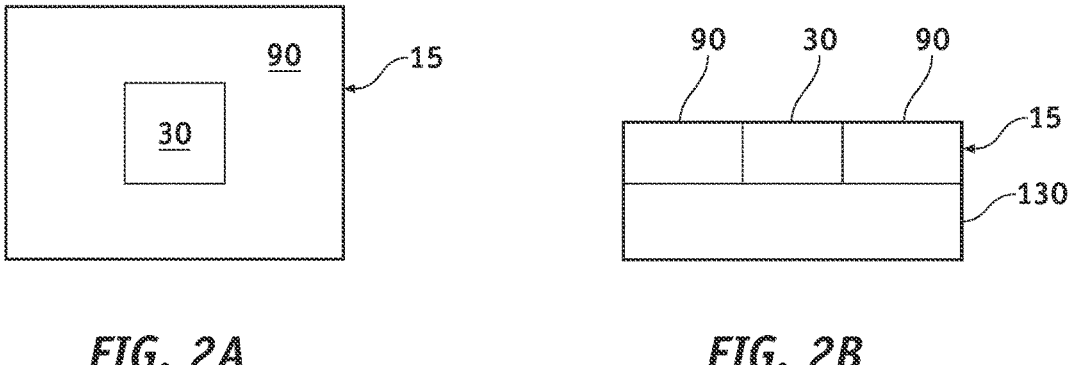
*FIG. 2A*               *FIG. 2B*
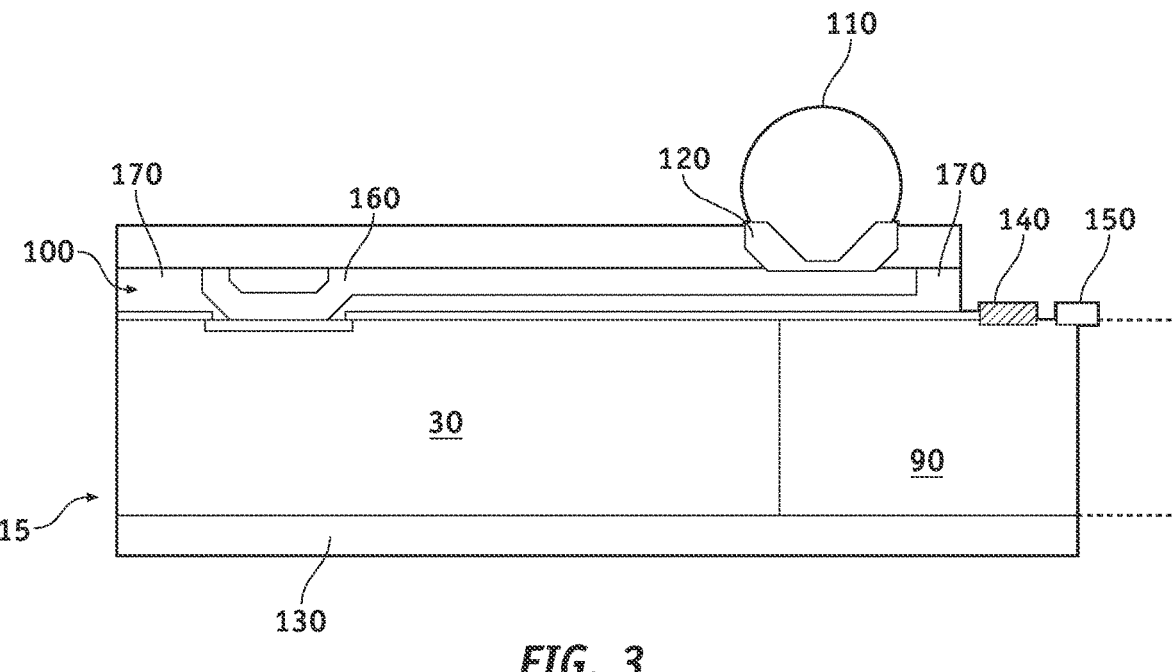
*FIG. 3*

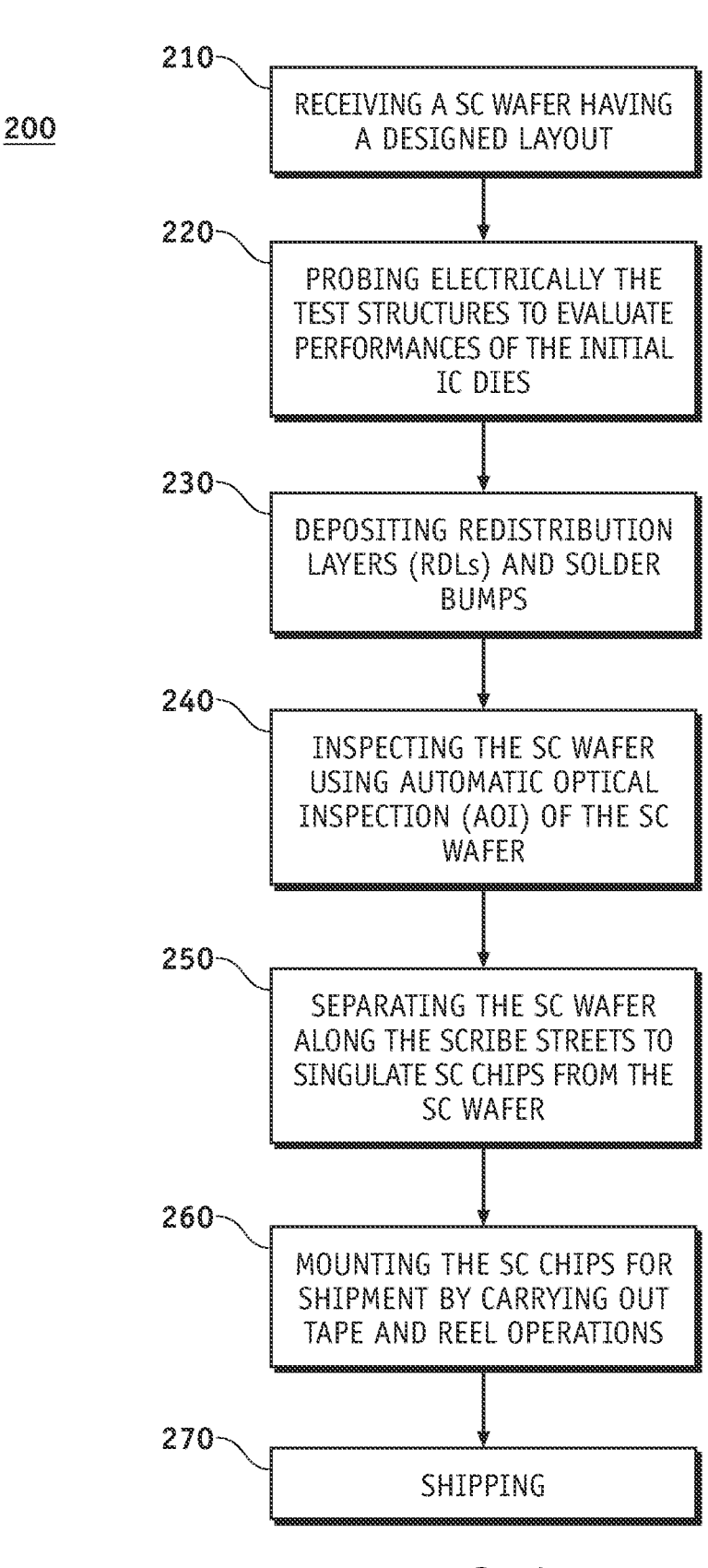

200

210 ⟶ RECEIVING A SC WAFER HAVING A DESIGNED LAYOUT

220 ⟶ PROBING ELECTRICALLY THE TEST STRUCTURES TO EVALUATE PERFORMANCES OF THE INITIAL IC DIES

230 ⟶ DEPOSITING REDISTRIBUTION LAYERS (RDLs) AND SOLDER BUMPS

240 ⟶ INSPECTING THE SC WAFER USING AUTOMATIC OPTICAL INSPECTION (AOI) OF THE SC WAFER

250 ⟶ SEPARATING THE SC WAFER ALONG THE SCRIBE STREETS TO SINGULATE SC CHIPS FROM THE SC WAFER

260 ⟶ MOUNTING THE SC CHIPS FOR SHIPMENT BY CARRYING OUT TAPE AND REEL OPERATIONS

270 ⟶ SHIPPING

*FIG. 4*

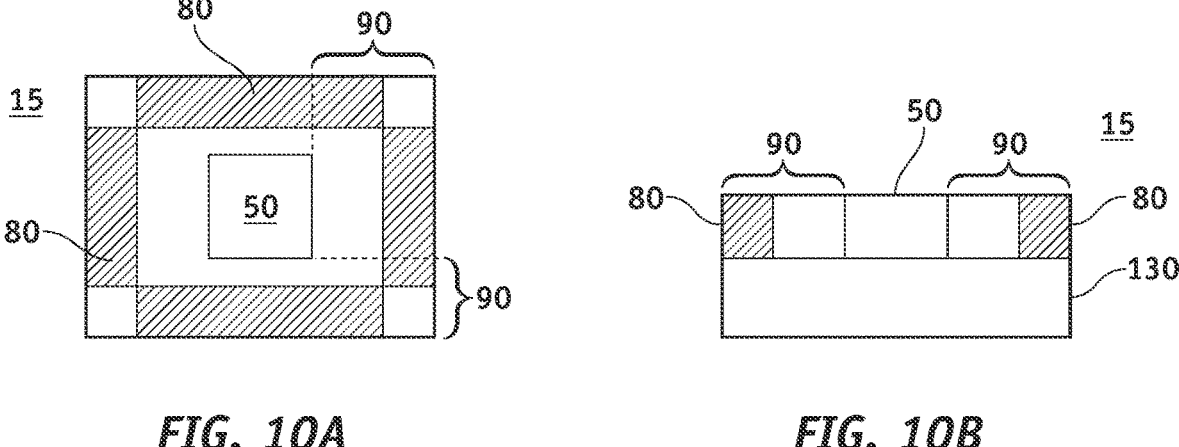
FIG. 10A                    FIG. 10B
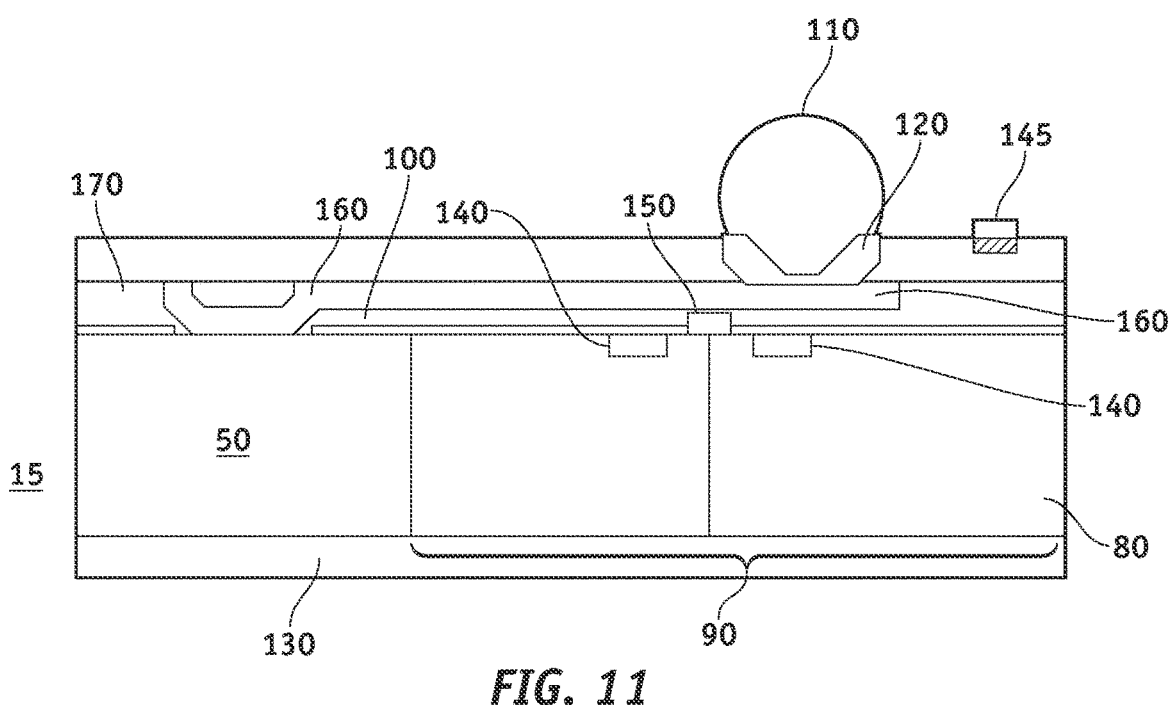
FIG. 11

WAFER FABRICATION PROCESS AND DEVICES WITH EXTENDED PERIPHERAL DIE AREA

FIELD OF DISCLOSURE

The present disclosure relates to electronic devices and systems, and methods for making and using the same.

BACKGROUND

Electronic devices and systems play an integral part of everyday life. The growing importance of electronic devices and systems to modern culture and the global economy has been largely attributed to semiconductor industry's adherence to Moore's Law. As the size of transistors has been reduced, their power consumption has been reduced, helping the industry to achieve increased transistor density at reduced costs. While Moore's Law benefits apply mostly to digital functions, they also apply to analog and RF functions, albeit to different levels. RF chips often have large devices that may not scale with each generation, but they must respond to rapidly changing product specifications and standards, thereby requiring short development times and rapid delivery of prototype chips, often much shorter delivery schedules than for large digital chips.

Semiconductor processing has specific rules on the minimum size and spacing for features on the chip that allow the die to shrink to reduce production costs and simultaneously improve performance partly due to an increasing transistor density.

Miniaturization rules of chips consequentially result in higher number of dies packed in the wafers. This miniaturization is beneficial because it allows the underlying electronic circuitry to be increasingly complex which often increases of the number of IO (input/output) connections needed to communicate to the macro world. When an integrated circuit is manufactured, it usually has a set of IO pads that are coupled to the pins of the package. Redistribution layers (often applied after a wafer leaves its fab facility) provide extra layers of wiring schemes that fan-out away from the chip thus providing a means for electronic coupling the IO contact pads to larger scaled solder balls. That is, by spreading, i.e., fanning out, the redistribution layers, the distal contact points are farther away from the die and make sufficient room available for solder balls to be applied. Because of this high density packing of dies on wafers, a problem may arise that restricts the available room to accommodate all of the solder balls needed to electrically communicate to the die. Therefore, there is a need to solve this problem brought about by miniaturization. Additionally, there is a need to enable rapid delivery of prototype dies.

SUMMARY

In recent wafer level fan-out packaging (WLFO) technology, the redistribution layers (RDL) extend outside the designed die size and rest on the mold-frame (fan-out area). The assembly process is complicated and has extremely longer cycle time. In the current invention, semiconductor wafers that make up a plurality of semiconductor (SC) chip devices and associated methods of making these SC chip devices are designed that considerably enlarge the available extension areas next to functional integrated circuit (IC) dies within these SC chip devices. These innovations provide sufficient room for mounting electrical contact platforms at the ends of patterned conductor arms of redistribution layers while assuring for ohmic contacts between the redistribution layers and the IC die. Some of the embodiments include designing SC wafers prior to fabrication so that the resultant IC dies in the SC chips are surrounded by considerably wider extension areas than the minimum necessary for die singulation and separation.

Other embodiments include processing post manufactured SC wafers to expand the size of the available extension areas by including truncated pieces of IC dies that are immediately adjacent to functional working primary IC dies. Specifically, for example for prototype SC chip packages with functional working primary IC dies therein, an embodiment includes sacrificing adjacent IC dies for extended fan-out areas that would be used for making rapid prototype packages. This embodiment would reduce the number of packages per SC wafer but beneficially shorten the assembly cycle time and produce a small number of prototype SC chip packages that are virtually identical to an ultimate version of final packages (in high volume production). In addition, if the overall unit cost is justified, this rapid prototype method can be transferred to volume production.

These variations provide additional room for redistribution layer arrangements to fan-out from the IC dies outwards onto the these enlarged extended fan-out areas. These variations can realize more rapid production of functional IC dies, especially for a need to produce rapid prototype SC chips, at the possible expense of lowering production volumes of these SC chips. In all embodiments, the benefit is primarily to shorten delivery times for prototype SC chips containing IC dies that are virtually identical to a final (i.e, high volume production) version of the SC chips containing IC dies.

According to a first embodiment, a semiconductor (SC) chip is provided, comprising: an integrated circuit (IC) die on a semiconductor substrate; an extended semiconductor fan-out area, on the semiconductor substrate, immediately adjacent to the IC die; and a redistribution layer (RDL) arrangement on the semiconductor substrate, the RDL arrangement comprising an RDL conductor arm and an RDL contact platform, the RDL contact platform being mounted at the extended semiconductor fan-out area, wherein the RDL arrangement fans out from the IC die onto the extended semiconductor fan-out area, such that the RDL conductor arm electrically couples together the IC die to the RDL contact platform mounted at the extended semiconductor fan-out area.

According to a second embodiment, a semiconductor chip fabrication method is provided, the fabrication method comprising: receiving a semiconductor wafer having a design layout that comprises: integrated circuit (IC) dies, on a semiconductor substrate of the semiconductor wafer, with adjoined extended semiconductor fan-out areas that are adjacent to the IC dies, seal rings on the extended semiconductor fan-out areas, and scribe streets on the extended semiconductor fan-out areas; depositing redistribution layer (RDL) arrangements, on the semiconductor substrate, the RDL arrangements comprising RDL conductor arms and an RDL contact platforms, the RDL contact platforms being mounted at the extended semiconductor fan-out areas, wherein the RDL arrangements fan-out from the IC dies onto the extended semiconductor fan-out areas; and separating the semiconductor wafer along scribe streets to singulate semiconductor (SC) chips from the semiconductor wafer with dicing procedures, wherein the SC chips comprise the IC dies conjoined with the extended semiconductor fan-out areas.

According to a third embodiment, a semiconductor (SC) chip is provided, comprising: a primary integrated circuit (IC) die on a semiconductor substrate; an extended semi-conductor fan-out area, on the semiconductor substrate, that comprises at least one truncated piece of a sacrificial IC die which is immediately adjacent to the primary IC die; and at least one redistribution layer (RDL) arrangement, on the semiconductor substrate, comprising an RDL conductor arm and an RDL contact platform, the RDL arrangement fanning out from the primary IC die onto the extended semiconductor fan-out area, such that the RDL conductor arm electrically couples together the primary IC die to the RDL contact platform which is mounted at the extended semiconductor fan-out area.

According to a fourth embodiment, a semiconductor (SC) chip manufacturing method is provided, the manufacturing method comprising: obtaining a semiconductor wafer that comprises initial integrated circuit (IC) dies between initial scribe streets; selecting some of the initial IC dies as primary IC dies and some of the initial IC dies as sacrificial IC dies; laying out new scribe streets across the semiconductor wafer to define extended semiconductor fan-out areas adjacent to the primary IC dies, such that the extended semiconductor fan-out areas comprise portions of the initial scribe streets and truncated pieces of sacrificial IC dies; and forming redistribution layer (RDL) arrangements on the semiconductor wafer, the RDL arrangements comprising RDL conductor arms and RDL contact platforms, wherein the RDL contact platforms are electrically coupled to the primary IC dies at the extended semiconductor fan-out areas, wherein the RDL arrangements fan-out from the primary IC dies onto the extended semiconductor fan-out areas.

A person skilled in the art will recognize that innovated embodiments of the present disclosure are counter-intuitive, because in each case there will consequently be a loss of yield, i.e., fewer dies produced per wafer. But in each case the cycle time reduction introduced by the disclosed methods of the present disclosure can be as much as 70-80% in producing both initial prototype IC dies and final production versions as compared with current standard wafer-level fan-out (WLFO) or flip-chip land grid array (FC-LGA) processes that slow down the speed of production.

BRIEF DESCRIPTION OF THE DRAWINGS

The present disclosure is best understood from the following detailed description when with the accompanying figures. Various features may be not drawn to scale and used for illustration purposes only. In fact, the dimensions of the various features may be arbitrarily increased or reduced for clarity of discussion.

FIG. 2A is a simplified stylized top view of a first embodiment of an SC chip composed of an IC die immediately adjacent to an extended fan-out area.

FIG. 2B is a simplified stylized cross-section side view of the SC chip of FIG. 2A.

FIG. 3 depicts a more detailed stylized partial cross-section side view of the SC chip embodiment of FIGS. 2A, 2B and 3.

FIG. 4 is a high-level flowchart of a method of fabricating the SC chip of FIGS. 2A, 2B and 3.

FIG. 10A depicts a simplified stylized top view of a second embodiment of a SC chip comprising an IC die immediately adjacent to an extended fan-out area in which the extended fan-out area includes additional truncated pieces of adjacent IC dies.

FIG. 10B depicts a simplified stylized cross-section side view of the SC chip of FIG. 10A.

FIG. 11 depicts a more detailed stylized partial cross-section side view of the embodiment of FIGS. 10A and 10B.

The same reference numerals refer to the same parts throughout the various figures.

DETAILED DISCLOSURE

Figure 1:
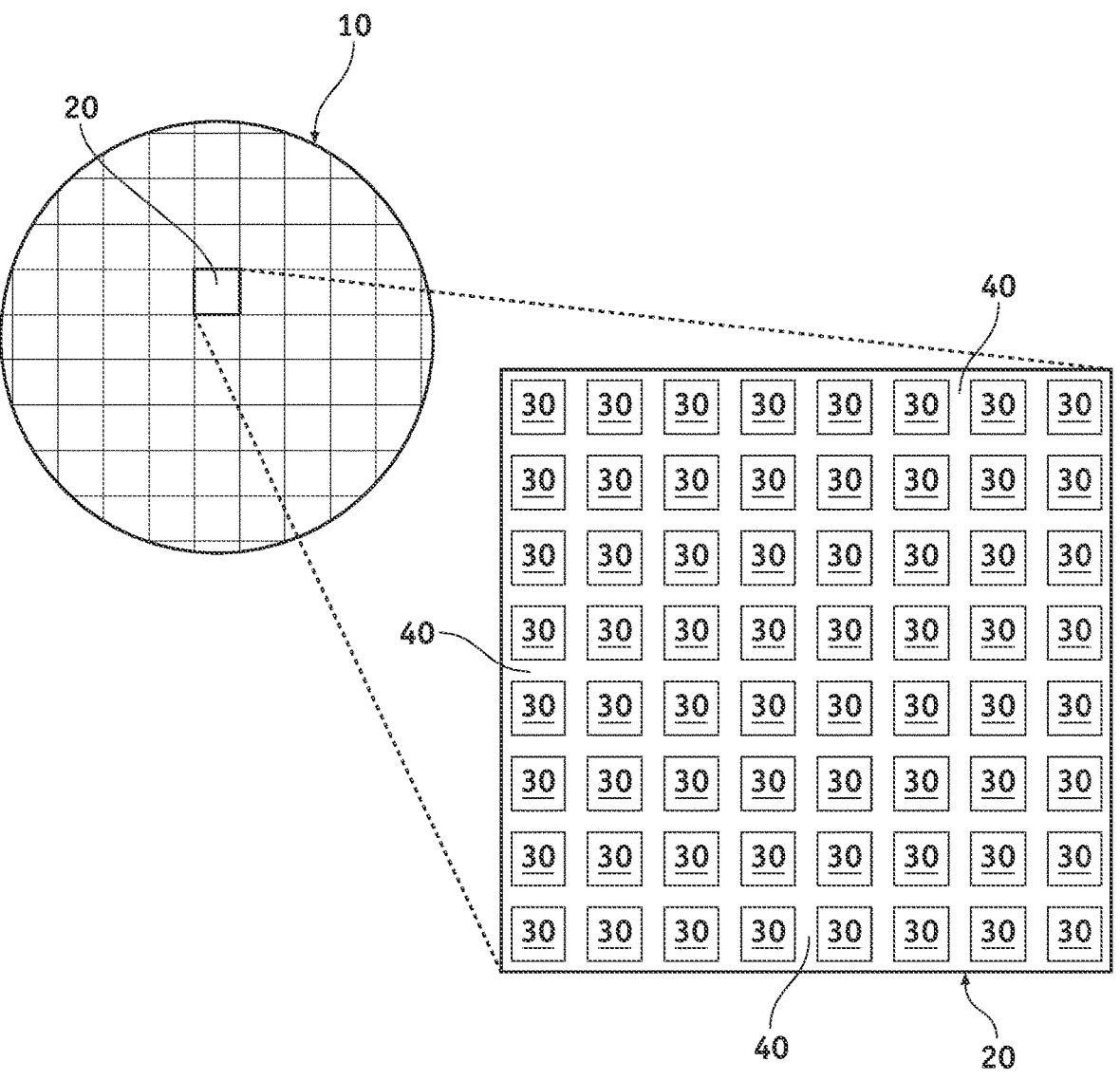
FIG. 1 is a diagrammatic top view of a semiconductor (SC) wafer having a plurality of exposure fields containing a plurality of initial integrated circuit (IC) dies surrounded by initial scribe streets that form an extended fan-out area around the initial IC dies.

FIG. 1 depicts a top view of a semiconductor wafer (10) comprising a plurality of exposure fields (20). Each exposure field (20) includes a plurality of initial IC dies (30) by expanded initial scribe streets (40).

FIGS. 2A-2B depict top and cross-sectional side views of an embodiment of a semiconductor (SC) chip (15) of the disclosure. This embodiment of the SC wafer (10) of FIG. 1 is shown to include, but is not limited to, an initial IC die (30), and extended fan-out areas (90). FIG. 2A shows that the initial IC die (30) and the extended fan-out areas (90) are immediately adjacent to each other. That is, no other components or elements, other than the initial scribe streets (40) that surround the initial IC die (30), are envisioned to be physically between the initial IC die (30) and the adjoining adjacent extended fan-out area (90). FIG. 2B shows that both the IC die (30) and the extended fan-out area are on an SC substrate (130).

Other variations of this embodiment provide that the extended fan-out area (90) need not surround completely the initial IC die (30) as long as the extended fan-out areas (90) are immediately adjacent to the initial IC die (30).

FIG. 3 shows that an RDL arrangement (100) is configured to fan-out from the initial IC die (30) outward onto the extended fan-out areas (90) and provide electrical connections between the initial IC die (30), in the SC chip (15), and into the extended fan-out area (90) in the SC chip (15). As noted above, the SC chip (10) includes a silicon substrate (preferably single crystalline silicon) or other proper substrate having material layers formed thereon. Other proper substrate materials include suitable elementary semiconductors, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

With continued reference to FIG. 3, a detailed partial cross-sectional view of the SC chip described above is shown. The initial IC die (30) (having an exemplary dimension of e.g. 4.3 mm on a side) is shown immediately adjacent to the extended fan-out area (90) (having an extension of e.g. 0.45 mm), wherein both are shown formed on the semiconductor substrate (130). The RDL arrangement (100) is shown fanning out from the initial IC die (30) outward onto the extended fan-out area (90) in which a patterned RDL conductor arm (160) of the RDL arrangement (100) provides electrical connections to the initial IC die (30) in the SC chip (15). An RDL contact platform (120) is shown electrically connected to a distal end of the RDL conductor arm (160). Also shown is a solder bump (110) electrically connected to the RDL contact platform (120), Passivation layers (170) are shown underneath and above the RDL conductor arm (160) in order to ensure electrical integrity and electrically insulate the conductor arm (160). The RDL contact platform (120) is shown mounted on and contacting the RDL conductor arm (160) on top of the extended fan-out area (90). A seal ring (140) is shown on the extended fan-out area (90). The broken lines to the right of FIG. 3 show part of an extended fan-out area for an adjacent IC dies of the SC chip (15) previously to dicing, wherein the test structure (150) may be located, at least partially, outside the SC chip (15).

The SC chip (15) may additionally include a plurality of RDL arrangements (100) that fan-out from the IC die (30) onto the extended fan-out area (90), such that the RDL arrangements (100) electrically couple together the initial IC die (30) in the SC chip (15) to a plurality of solder bumps (110) mounted at the extended fan-out areas (90).

A person skilled in the art would recognize that the SC chip (15) comprises the initial IC die (30), the extended fan-out area (90) and the RDL arrangements (100) illustrated in FIGS. 2A-2B and FIG. 3. That is, FIGS. 2A, 2B and 3 have been simplified for the sake of clarity and each may contain additional and/or different features.

According to a preferred embodiment, the integrated circuit for the initial IC die (30) of the SC chip (15) is designed, before fabrication on the SC wafer (10), in a way that the extended fan-out area (90) is already taken into consideration at the mask-generation step.

Referring now to FIG. 4, illustrated is a high-level flow chart of a fabrication method (200) of designing and fabricating integrated circuit devices on semiconductor wafers according to various aspects of the present disclosure. The illustrated fabrication method (200) is carried out by the procedural operations of receiving (210), probing (220), depositing (230), inspecting (240), separating (250), and mounting (260) to manufacture the SC chip previously described in FIGS. 2A, 2B and 3, with an optional shipping (270) procedure.

The receiving (210) operational procedure of the SC chip (15) manufacturing fabrication method (200) includes receiving a semiconductor wafer (10) having a design layout that comprises: initial IC dies (30), on a semiconductor substrate (130) of the semiconductor wafer (10), with adjoined extended fan-out areas (90) as shown and described in FIGS. 2A, 2B and 3 above.

FIGS. 1, 3 and 4 show that the semiconductor wafer (30) may then be subjected to testing to ensure the integrated circuits formed thereon conform to the manufacturing specifications and electrical performance specifications. Commonly, test structures (150) (and/or process control monitors), as shown in FIG. 3, can be formed at the extended fan-out area (90) on the semiconductor substrate (130) of the semiconductor wafer (10) during lithography and may be utilized to generate test data to judge the quality of the prior fabrication process, see e.g., test structure (150) shown in FIG. 3. Accordingly, the probing operational procedure of the SC chip (15) fabrication method (200) includes probing (220) electrically the test structures (150) to evaluate performances of the initial IC dies (30).

After the semiconductor wafer (10) passes wafer testing, a depositing (230) operational procedure of the SC chip (15) is envisioned, to include depositing, patterning and etching redistribution (RDL) arrangements (100), and optionally including solder bumps (110), on the SC chips (15) while on the semiconductor wafer (10).

After depositing (230) the RDL arrangements (100) and optionally providing the solder bumps (110), the SC chip (15) performance is again evaluated by implementing an inspecting (240) operational procedure of the SC chip (15). This may include inspecting the semiconductor wafer (10) using automatic optical inspection (AOI).

After inspecting (240), a separating (250) operational procedure of the SC chip (15) manufacturing method (200) is included that separates the semiconductor wafer along the initial scribe streets (60) to singulate SC chips (15) from the semiconductor wafer (10) using, for example, backside griding (BSG) and dicing procedures. The dicing process can be accomplished by scribing and breaking, by mechanical sawing (e.g., with a dicing saw) or by laser cutting.

After separating (250), the mounting (260) operational procedure of the SC chip (15) manufacturing method is intended to include mounting the SC chips (15) for shipment by, for example, carrying out tape and reel operations, or pick and place operations, or plate some of the SC chips as a waffle pack or other containers.

An optional additional procedure of shipping (270) the assembled SC chip (15) can also be included.

It is understood that the above-described fabrication method of making SC chips is simply an example embodiment, and that alternative embodiments, additional and/or different operational procedures may be included.

Figure 5:
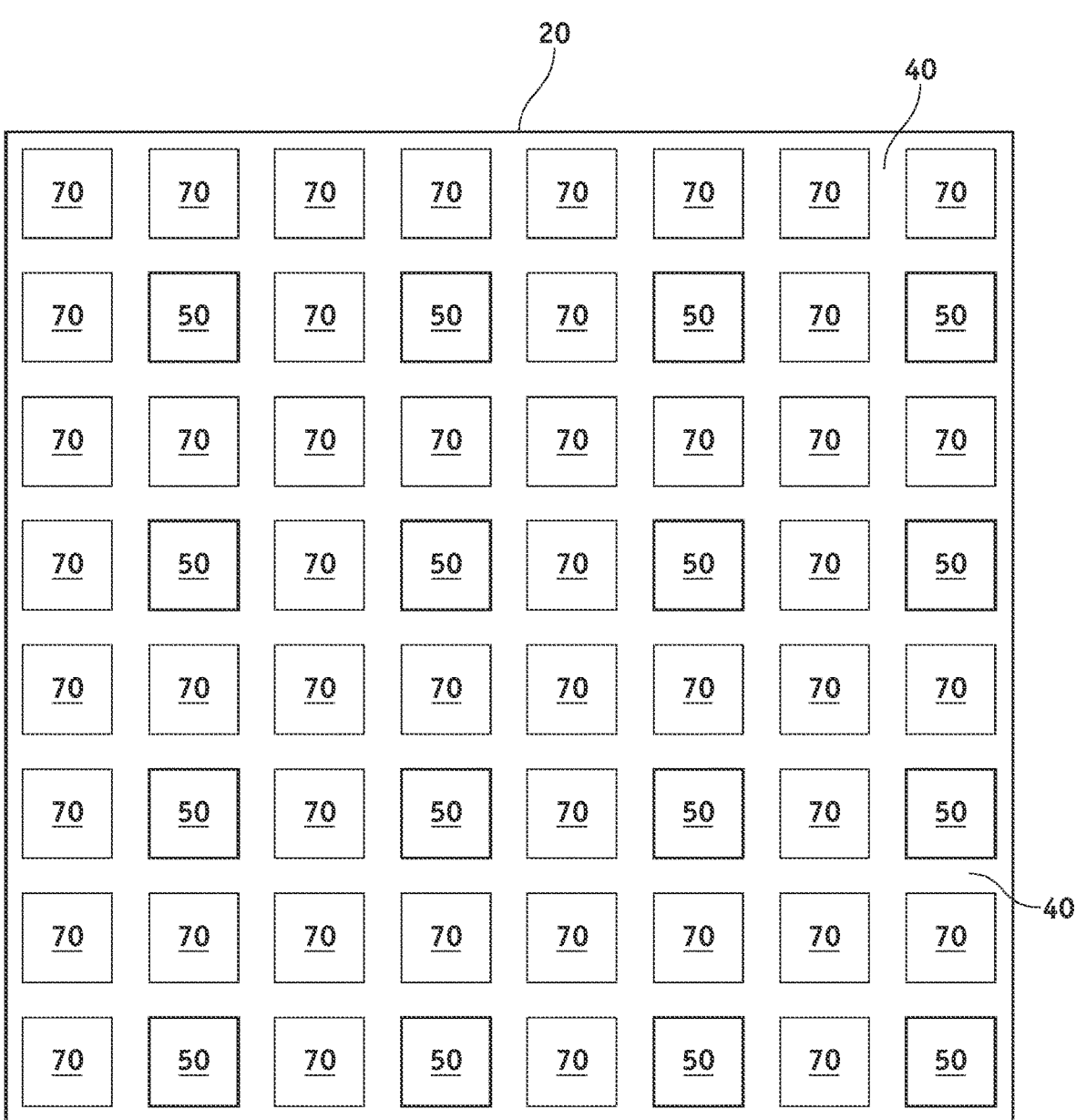
FIG. 5 is a diagrammatic top view of one of the exposure fields of the SC wafer of FIG. 1 where the initial IC dies are selected to be either primary IC dies or sacrificial IC dies.

Reference will now be made to FIGS. 5, 10A and 10B which schematically depict another embodiment of SC chip (15) of the present disclosure. This embodiment is brought about by a need or desire to obtain the available extension area from designed and fabricated semiconductor wafers that layout multiple initial IC dies (30) without providing sufficient room to expanding the fan-out the RDL arrangements (100). It should be noted that the initial IC dies (30) may be either all identical or be assortments of different circuitry configurations. The financial cost of sacrificing some of the adjacent initial IC dies (30), also called sacrificial IC dies (7)) throughout the disclosure, around a primary IC die (50) to enlarge the extended fan-out area (90) is overcome by the financial rewards associated with reducing the processing time to rapidly produce and timely provide the resultant SC chips (15) to a customer for sampling or production.

As shown in FIGS. 5, 10A and 10B, the SC chip (15) comprises a primary IC die (50) and an extended fan-out area (90) that includes at least one truncated piece (80) of a sacrificial IC die (70) (see e.g. FIG. 5). The primary IC die (50) and the immediately adjacent extension area (90) are shown on a semiconductor substrate (130). The sacrificial IC die (70) is an IC die adjacent to IC die (50) that may be identical to IC die (50).

Differently from the previous disclosed embodiment, here FIGS. 5-11 show that the extended fan-out area (90) includes at least one truncated piece (80) of a sacrificial IC die (70). The advantage of including at least one truncated piece (80) of an adjacent sacrificial IC die (70) in the extended fan-out area (90) simply provides more room to fan-out the RDL arrangement (100) onto a more enlarged area than previously available. Variations of this embodiment provide that the enlarged extended fan-out area (90) need not surround completely the primary IC die (50), as long as the extended fan-out area (90) is adjacent to the primary IC die (50) and that the extended fan-out area (90) includes at least one truncated piece (80) of a sacrificial IC die (70).

Similarly to the previous embodiment, the substrate (130) may be a silicon substrate (e.g. made of single crystalline silicon) or other proper substrate having material layers formed thereon. Other proper substrate materials include suitable elementary semiconductors, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

FIG. 11 depicts a more detailed partial cross-sectional view of the SC chips (15) shown in FIGS. 10A and 10B. The primary IC die (50) is shown immediately adjacent to the enlarged extended fan-out area (90), both on the SC substrate (130). The RDL arrangement (100) having a distal end of an RDL conductor arm (160) coupled to an RDL contact platform (120) is shown fanning out from the primary IC die (50) outward onto the enlarged extended fan-out area (90) containing a truncated piece (80) of an adjacent sacrificial IC die (70). The RDL arrangement (100) is shown comprising a RDL conductor arm (160) that electrically couples together the primary IC die (50) and the RDL contact platform (120) which, in turn, can be electrically coupled to a solder bump (110) on top of the extended fan-out area (90). The RDL arrangement (100) also includes passivation layers (170) around, underneath and above the RDL conductor arm (160) that electrically insulate the RDL conductor arm (160).

FIG. 11 shows initial seal rings (140) and an initial test structure (150) being sacrificed, that is, being buried underneath passivation layer (170). New dicing lines (145) (made of e.g. copper) are provided on top of the extended fan-out area (90) to define new scribe streets and allow dicing equipment alignment at the time of singulation of the wafer (10) into a plurality of SC chips (15).

Figure 12:
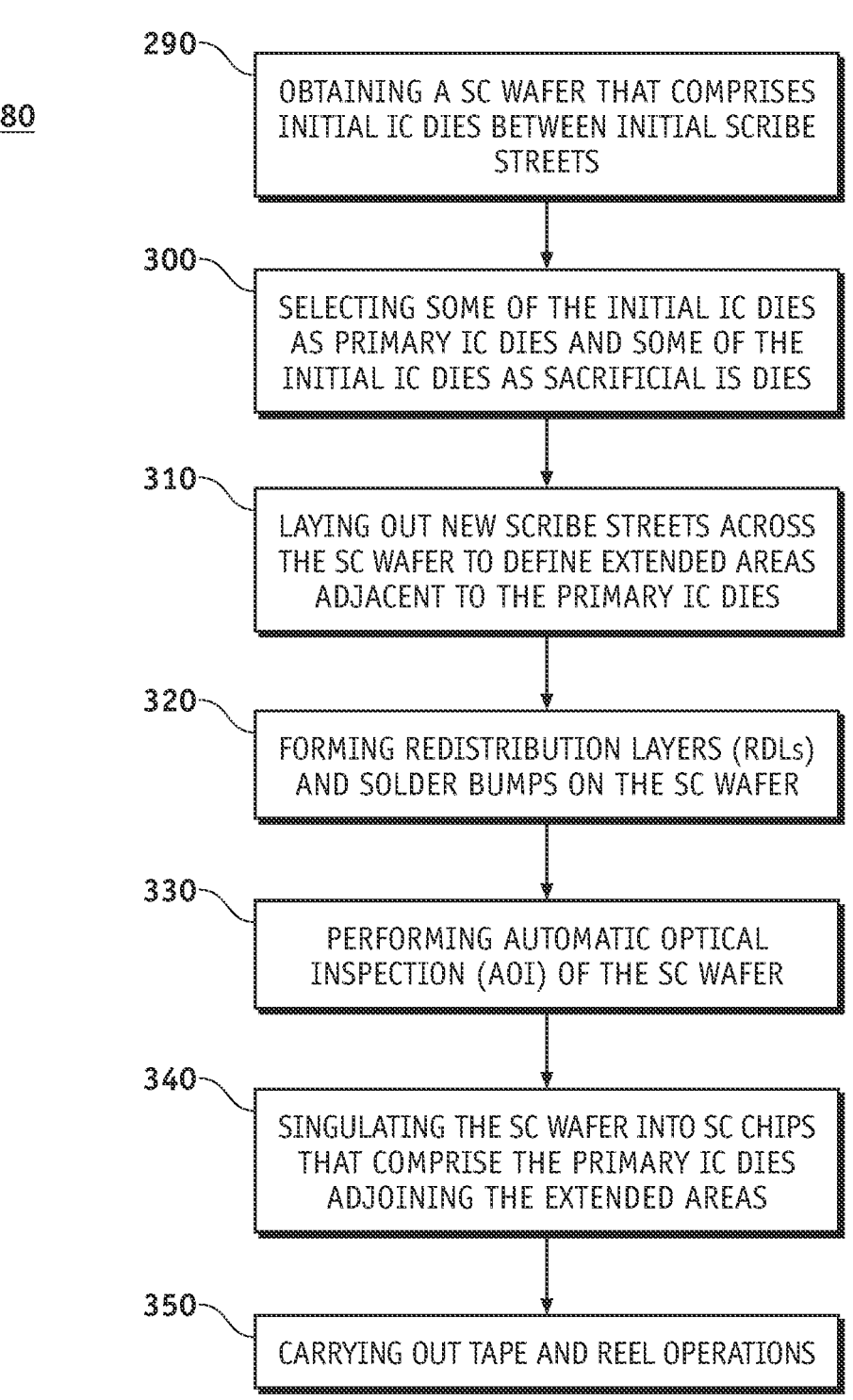
FIG. 12 is a high-level flowchart of a method of fabricating the SC chips of FIGS. 10A, 10B and 11.

Reference will now be made to FIG. 12, which illustrates a high-level flow chart of a manufacturing method (280) of designing and fabricating integrated circuit devices on semiconductor wafers according to the embodiment shown in FIGS. 10A, 10B and 11. The illustrated manufacturing method (280) is carried out by the procedural operations of obtaining (290), selecting (300), laying out (310), and forming (320). The manufacturing method may also include additional procedural operations of performing (330), singulating (340), and carrying out (350). If needed, there can be a final test performed in step (330) or prior to step (340).

The obtaining (290) operational procedure of the SC chip manufacturing method (280) includes obtaining a semiconductor wafer (10) that comprises initial IC dies (30) between initial scribe streets (40).

The selecting (300) operational procedure of the SC chip manufacturing method (280) includes selecting some of the initial IC dies (30) as primary IC dies (50) and some of the initial IC dies (30) as sacrificial IC dies (70).

The laying out (310) operational procedure of the SC chip (15) manufacturing method (280) includes laying out new scribe streets (40) across the semiconductor wafer (10) to define extended fan-out areas (90) adjacent to the primary IC dies (50), such that the extended fan-out areas (90) comprise portions of the initial scribe streets (40) that are next to the primary IC dies (50) and portions of the sacrificial IC dies (70) that are adjacent to the primary IC dies (50).

The forming (320) operational procedure of the SC chip (15) manufacturing method includes forming RDL arrangements (100) and optionally forming solder bumps (110) on the semiconductor wafer (10) that electrically couple together the primary IC dies (50) to the solder bumps (110) mounted at the extended fan-out areas (90), wherein the RDL arrangements (100) fan-out from the primary IC dies (50) onto the extended fan-out areas (90).

The operational procedures of obtaining (290), selecting (300), laying out (310), and forming (320) are usually processed at a single facility.

An additional optional set of procedures of performing (330), singulating (340), and carrying out (350) can also be included in the manufacturing method (280). The optional performing (330) operational procedure of the SC chip (15) manufacturing method includes performing automatic optical inspection (AOI) of the semiconductor wafer (10). The optional singulating (340) operational procedure of the SC chip (15) manufacturing method includes singulating the semiconductor wafer (10) along the new scribe streets (60) into SC chips (15) that comprise the primary IC dies (50) adjoining the extended fan-out areas (90) by using backside griding (BSG) and dicing procedures. The optional carrying out (350) operational procedure of the SC chip (15) manufacturing method can include carrying out tape and reel (TnR) operations to mount the SC chips (15) for shipment. The operational procedures of performing 330, singulating 340, and carrying out 350 may be performed at single facility.

Reference will now be made to FIGS. 1 and 5-7 which show, in combination, a diagrammatic illustration of the operation procedure showing selecting (300) of some of the initial IC dies (30) as primary IC dies (50) and some of the initial IC dies (30) as sacrificial IC dies (70). This selecting operation procedure does not involve physically changing the initial IC dies (30) but rather is an arbitrary selection procedure that renames or assigns some of the initial IC dies (30) as being primary IC dies (50) and renames or assigns some of the initial IC dies (30) as being sacrificial IC dies (70). The outstanding requirement in selecting is that the selected primary IC die (50) is adjacent to at least one sacrificial IC die (70). In the embodiment shown in FIGS. 5-7, the selected primary IC die (50) is adjacent to up to eight truncated pieces (80) of neighboring sacrificial IC dies (70), but other kinds of selections are also possible.

Figure 6:
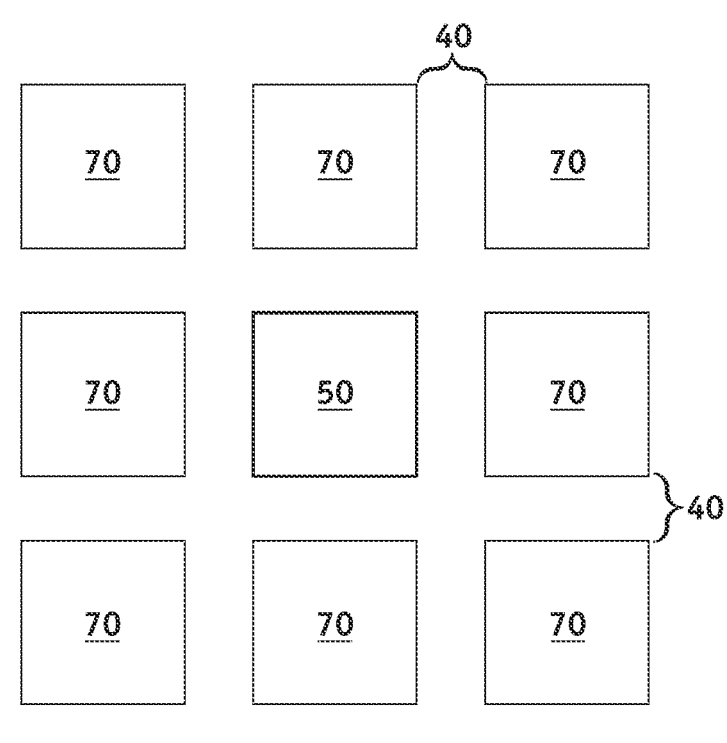
FIG. 6 is a close-up top view of a portion of FIG. 5, showing a primary IC die immediately surrounded by adjacent sacrificial IC dies.

FIG. 6 depicts a partial magnified view of a portion of the exposure field (20) of the semiconductor wafer (10) (see also FIG. 1) showing the selected primary IC die (50) being adjacent to eight adjacent sacrificial IC dies (70).

Figure 7:
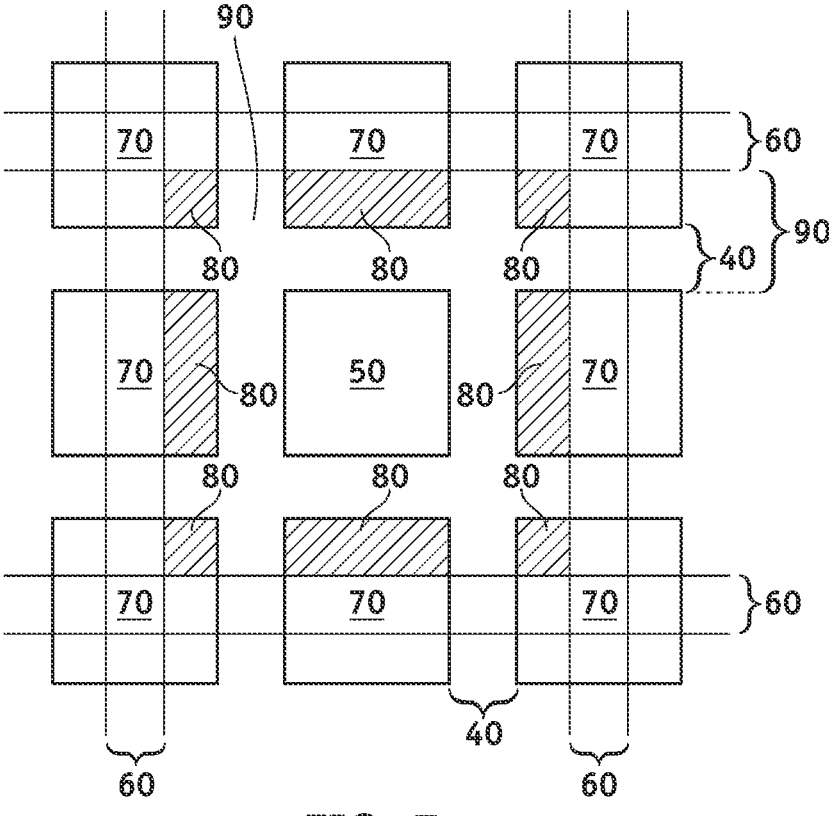
FIG. 7 is a top view of FIG. 6 showing new scribe streets laid out on the sacrificial IC dies.

FIGS. 6-7 depict the operation procedure (310) (see previously described FIG. 12) of laying out new scribe streets (60) over the neighboring sacrificial IC dies (70) that surround the primary IC die (50). This laying out procedure results in enlarging the expanded fan-out area (90) next to the primary IC die (50) by incorporating truncated pieces (80) of adjacent sacrificial IC dies (70).

Figure 8:
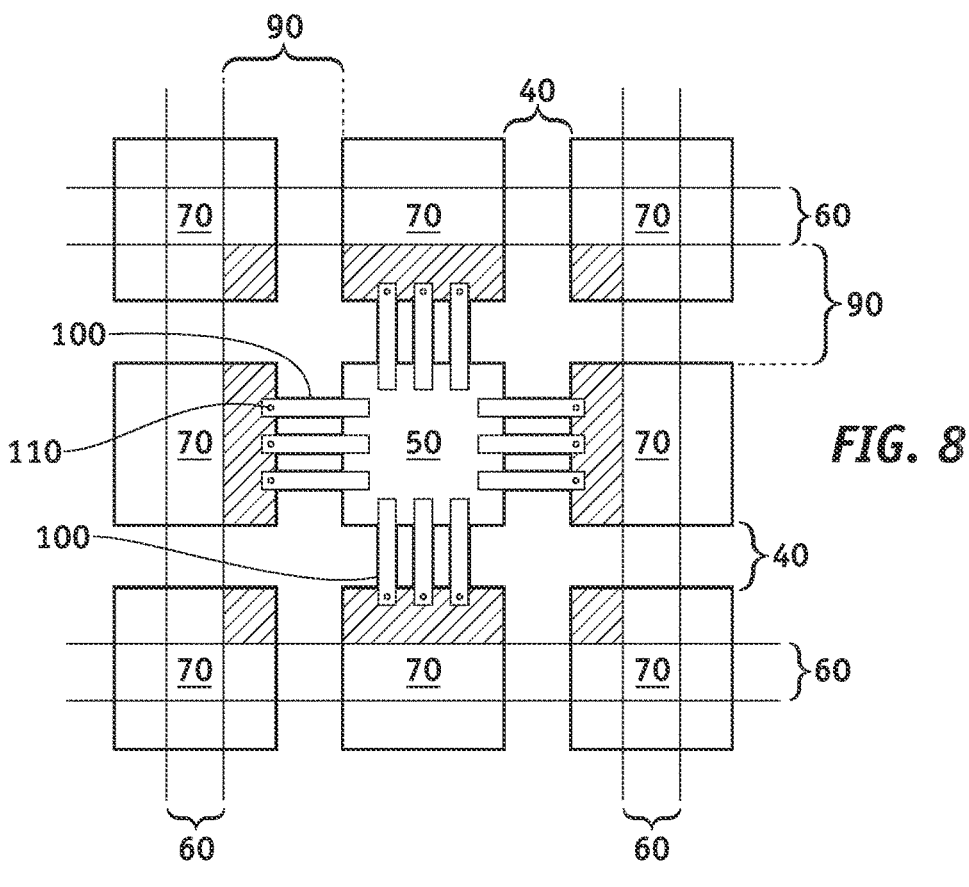
FIG. 8 is a top view of the portion of FIG. 7 that shows redistribution layer (RDL) arrangements formed over the primary IC die and into the extended fan-out area of the SC chip that contains pieces of the sacrificial IC dies.

FIGS. 7-8 depict the operation procedure of forming RDL arrangements (100) and solder bumps (110) on the SC wafer that electrically couple together the primary IC dies (50) to the RDL arrangements (100) that fan-out on the expanded extended fan-out areas (90). As a consequence of the expansion of the extended fan-out area (90), truncated pieces (80) of sacrificial IC dies (70) are incorporated in the extended fan-out area (90). The RDL arrangement (100) can be laid out to fan-out farther onto the expanded extended fan-out areas (90).

With continued reference to FIG. 8, after solder bumps (110) are deposited the semiconductor wafer (10) on the RDL arrangements (100) in the extended fan-out area (90), then the resultant semiconductor wafer (10) can be subjected to the operational procedure of performing (330) automatic optical inspection (AOI) to further evaluate the semiconductor wafer (10).

Figure 9:
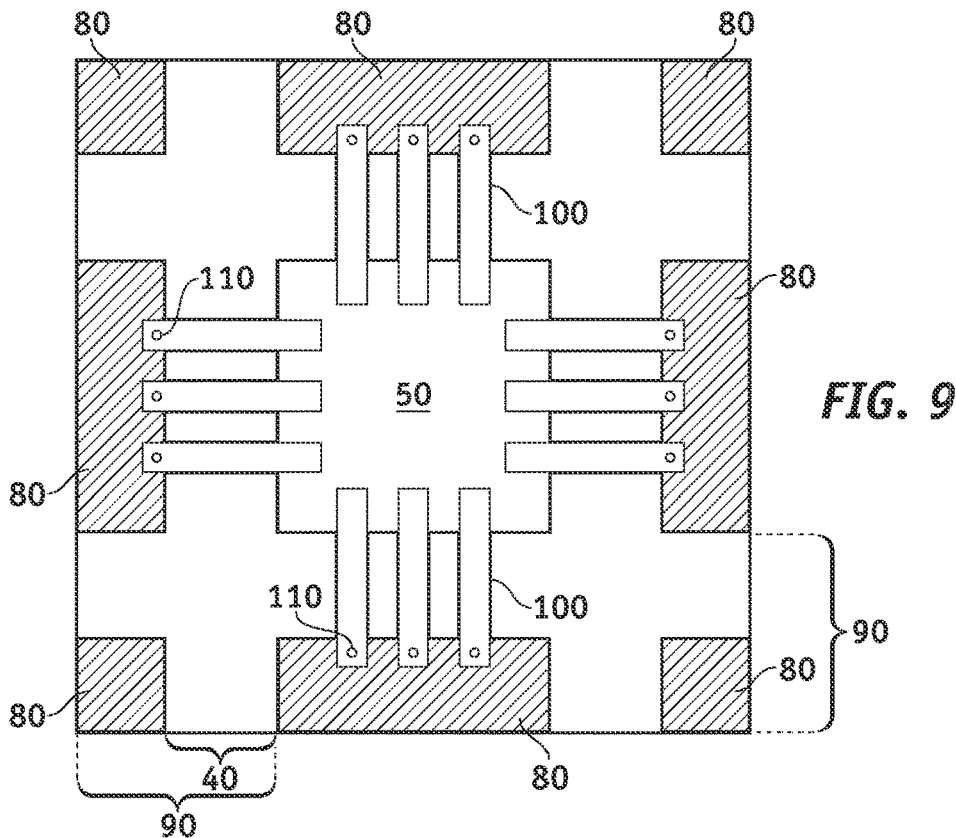
FIG. 9 is a top view of a singulated SC chip of FIG. 7 separated from the SC wafer showing RDL arrangements formed over the primary IC die and into the extended fan-out area of the singulated SC chip showing that the singulated SC chip contains truncated pieces of the sacrificial IC dies.

With reference now to FIGS. 1 and 8-9, the operation procedure of the singulating the semiconductor wafer (10) along the new scribe streets (60) into singulated SC chips (15) is shown. The singulated SC chips (15) comprise the primary IC dies (50) adjoining the extended fan-out areas (90) that include parts of the initial scribe streets (40) and some of the adjacent truncated pieces (80) of the sacrificial IC dies (70). It should be noted that the region between IC dies (50) may be no larger than the minimum scribe street needed for dies singulation (i.e., there may be no added extension area (90) as described with reference to the previous embodiment).

In practicing the above described fabrication methods (200) and (280) according to the embodiments of the present disclosure, a substantial time saving advantage can be realized when implementing the SC chip according to the teachings of FIGS. 1A, 1B and 2 or FIGS. 4A, 4B and 5. The operational procedures of the fabrication methods (200) and (280) can and have been accomplished at a single manufacturing facility which can realize a time saving advantage up to 83% reduction in assembly flow cycle time at a single manufacturing facility. It is important to note that the fabrication methods of the present disclosure do not utilize wafer level fan-out (WLFO) packaging processes and also do not utilize flip chip land grid array (FcLGA) packaging processes which would require multiple manufacturing facilities and therefore substantially more time.

When the time saving advantage is high, the teachings of the present disclosure will be well suited not only for a sampling operation (where a single or small number of sample(s) is shipped to the customer) but also for the production stage of the final product. By way of example, the embodiment of FIGS. 2A, 2B, 3 and 4 can be used for evaluation sample purposes, while the embodiment of FIGS. 5-12 can be used for building the final product, and in both cases with substantially reduced lead time. As unit volume increases along with associated cost pressure, standard packaging can be applied to all the IC dies (30) of FIG. 1, thereby increasing yield and lowering cost (although at an increased lead time that can be accommodated in steady-state supply conditions). If this is the case, the production process or design may need to take care of minor input impedance changes due to the differences between the two embodiments.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable various applications including signal, data, and power transmission; power management; wireless communications; data conversions; data processing; and other such applications.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A semiconductor (SC) chip comprising: an integrated circuit (IC) die formed on a semiconductor substrate; an extended semiconductor fan-out area, integral with the IC die and formed from the same semiconductor substrate material as the IC die, formed on the semiconductor substrate, immediately adjacent to the IC die, said extended semiconductor fan-out area extending laterally beyond a footprint defined by the IC die; and a redistribution layer (RDL) arrangement on the IC die and the extended semiconductor fan-out area, the RDL arrangement comprising an RDL conductor arm and an RDL contact platform, the RDL contact platform being mounted at the extended semiconductor fan-out area laterally outside the footprint defined by the IC die, wherein the RDL arrangement fans out from the IC die onto the extended semiconductor fan-out area, such that the RDL conductor arm electrically couples together the IC die to the RDL contact platform mounted at the extended semiconductor fan-out area.

2. The SC chip of claim 1, wherein the RDL arrangement comprises a plurality of RDLs that fan-out from the IC die onto the extended semiconductor fan-out area, such that the RDLs electrically couple together the IC die to a plurality of RDL contact platforms mounted at the extended semiconductor fan-out area.

3. The SC chip of claim 1, further comprising a seal ring, on the semiconductor substrate, surrounding the extended fan-out area and the IC die.

4. The SC chip of claim 1, further comprising a test structure, on the extended semiconductor fan-out area, which is electrically coupled to the IC die.

5. The SC chip of claim 1, wherein the RDL arrangement comprises:

passivation layers around the RDL conductor arm that electrically insulate the RDL conductor arm.

6. The SC chip of claim 1, wherein the extended semiconductor fan-out area surrounds the IC die.

7. The SC chip of claim 1, wherein the semiconductor substrate comprises single crystalline silicon.

8. A semiconductor (SC) chip comprising: a primary integrated circuit (IC) die formed on a semiconductor substrate; an extended semiconductor fan-out area, formed on the semiconductor substrate, integral with the primary IC die and formed from the same semiconductor substrate material as the primary IC die, that comprises at least one truncated piece of a sacrificial IC die which is immediately adjacent to the primary IC die, said extended semiconductor fan-out area providing increased area for redistribution layer (RDL) fan-out; and at least one RDL arrangement, on the IC die and the extended semiconductor fan-out area, comprising an RDL conductor arm and an RDL contact platform, wherein the RDL contact platform is mounted on the truncated piece of the sacrificial IC die within said extended semiconductor fan-out area, the at least one RDL arrangement fanning out from the primary IC die onto the truncated piece of the sacrificial IC die within the extended semiconductor fan-out area, such that the RDL conductor arm electrically couples together the primary IC die to the RDL contact platform.

9. The SC chip of claim 8, wherein the RDL arrangement comprises:

passivation layers around the RDL conductor arm that electrically insulate the RDL conductor arm.

10. The SC chip of claim 8, wherein:

the at least one truncated piece of a sacrificial IC die are a plurality of truncated pieces of sacrificial IC dies, on the semiconductor substrate, that surround and are immediately adjacent to the primary IC die, and the at least one RDL arrangement are a plurality of RDL arrangements, on the semiconductor substrate, that fan-out from the primary IC die onto the plurality of truncated pieces of sacrificial IC dies.

11. The SC chip of claim 8, wherein the semiconductor substrate comprises single crystalline silicon.

12. The SC chip of claim 8, wherein the at least one RDL arrangement is over a plurality of seal rings.

13. The SC chip of claim 8, wherein the at least one RDL arrangement is over a test structure.

\* \* \* \* \*